US007570073B2

United States Patent

(12) Xiao et al.

(10) Patent No.: US 7,570,073 B2

(45) Date of Patent: Aug. 4, 2009

(54) SYSTEM FOR TESTING POWER SUPPLY PERFORMANCE

(75) Inventors: Ren-Jun Xiao, Shenzhen (CN); Xiao-Lin Gan, Shenzhen (CN); Yu-Kuang Ho, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 165 days.

(21) Appl. No.: 11/834,018

(22) Filed: Aug. 6, 2007

(65) Prior Publication Data

US 2008/0061797 A1 Mar. 13, 2008

(30) Foreign Application Priority Data

Sep. 13, 2006 (CN) ........................ 2006 1 0062574

(51) Int. Cl.
*G01R 31/36* (2006.01)

(52) U.S. Cl. ........................................................ 324/771

(58) Field of Classification Search ................ 324/73.1, 324/158.1, 434, 439, 649, 765
See application file for complete search history.

(56) References Cited

U.S. PATENT DOCUMENTS

| | | | | |
|---|---|---|---|---|
| 5,397,999 | A * | 3/1995 | Kanamaru .................. | 324/771 |
| 6,639,409 | B2 * | 10/2003 | Morimoto et al. ........... | 324/434 |
| 7,112,988 | B2 | 9/2006 | Xiao | |
| 7,436,200 | B1 * | 10/2008 | Jacobsen et al. ............ | 324/771 |

* cited by examiner

*Primary Examiner*—Ha T. Nguyen
*Assistant Examiner*—Joshua Benitez
(74) *Attorney, Agent, or Firm*—Frank R. Niranjan

(57) ABSTRACT

A system for testing power supply performance is provided. The system includes a power supply having a plurality of outputs for outputting voltages, a plurality of display units corresponding to the plurality of outputs, for reflecting performance of the power supply, a plurality of resistance-matching selectors corresponding to the plurality of outputs, for supplying selective resistance, a voltage adjustable direct current source, and a selective switch. The display units are connected between first terminals of the outputs and the resistance-matching selectors, respectively. The resistance-matching selectors are in turn connected to ground. The voltage adjustable direct current source has a pole selectively connected to a second terminal of one of the outputs via the selective switch, and another pole grounded.

7 Claims, 1 Drawing Sheet

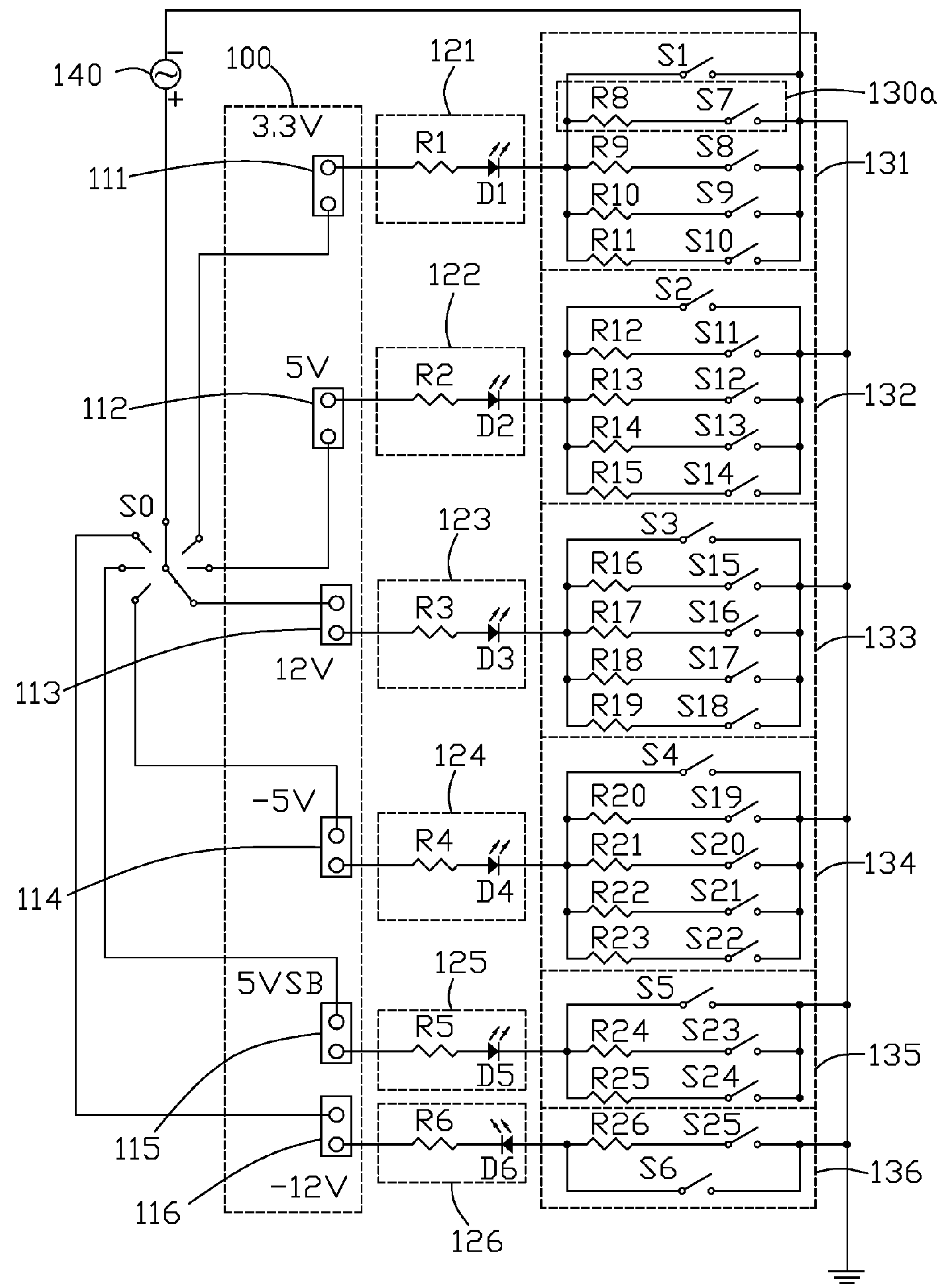
140
100
3.3V
121
S1
R8
S7
130a
R1
R9
S8
111
D1
R10
S9
131
R11
S10
122
S2
R12
S11
5V
R2
R13
S12
112
132
D2
R14
S13
R15
S14
S0
123
S3
R16
S15
R3
R17
S16
133
D3
12V
R18
S17
113
R19
S18
124
S4
R20
S19
-5V
R4
R21
S20
114
D4
134
R22
S21
R23
S22
125
5VSB
S5
R5
R24
S23
D5
R25
S24
135
R6
R26
S25
115
D6
S6
136
116
-12V
126

SYSTEM FOR TESTING POWER SUPPLY PERFORMANCE

BACKGROUND

1. Field of the Invention

The present invention relates to testing systems, and particularly to a system for testing power supply performance.

2. Description of Related Art

Commonly electronic apparatuses are not equipped with internal power supply devices to save on space and costs. Therefore, the electronic apparatuses require external power supplies.

When power supplies provide over-voltage or over-current to electronic apparatuses, the electronic apparatuses may be damaged. Nowadays, most power supplies include protecting circuits that have over-voltage protection and over-current protection functions. If a voltage output from a power supply is higher than a rated value, a protecting circuit in the power supply is activated, and the output is disabled. The over-voltage protection and over-current protection functions of the power supply must be fully operational in order to keep the electronic device working normally.

What is needed, therefore, is to provide a system for testing performance, such as the over-voltage protection and over-current protection functions, of a power supply.

SUMMARY

A system for testing power supply performance is provided. In an embodiment, the system includes a power supply having a plurality of outputs for outputting voltages, a plurality of display units corresponding to the plurality of outputs, for reflecting performance of the power supply, a plurality of resistance-matching selectors corresponding to the plurality of outputs, for supplying selective resistance, a voltage adjustable direct current source, and a selective switch. The display units are connected between first terminals of the outputs and the resistance-matching selectors, respectively. The resistance-matching selectors are in turn connected to ground. The voltage adjustable direct current source has a pole selectively connected to a second terminal of one of the outputs via the selective switch, and another pole grounded.

Other objects, advantages and novel features of the present invention will become more apparent from the following detailed description of preferred embodiment when taken in conjunction with the accompanying drawings, in which:

BRIEF DESCRIPTION OF THE DRAWINGS

The drawing is a system for testing power supply performance, in accordance with an embodiment of the present invention.

DETAILED DESCRIPTION

Referring to the drawing, a system for testing power supply performance in accordance with an embodiment of the present invention includes a power supply 100 having a plurality of outputs 111, 112, . . . 116, a plurality of display units 121, 122, . . . 126, a plurality of resistance-matching selectors 131, 132, . . . 136, a voltage adjustable direct current source 140, and a selective switch S0. The outputs 111, 112, . . . 116 offer voltages 3.3V, 5V, 12V, −5V, 5VSB, −12V, respectively. Each of the outputs 111, 112, . . . 116 has a first terminal and a second terminal.

Each of the resistance-matching selectors 131, 132, . . . 136 supplies selective resistance. The resistance-matching selector 131 includes four parallel resistance units 130*a* in parallel with a switch S1. The resistance-matching selector 132 includes four parallel resistance units 130*a* in parallel with a switch S2. The resistance-matching selector 133 includes four parallel resistance units 130*a* in parallel with a switch S3. The resistance-matching selector 134 includes four parallel resistance units 130*a* in parallel with a switch S4. The resistance-matching selector 135 includes two parallel resistance units 130*a* in parallel with a switch S5. The resistance-matching selector 136 includes a resistance unit 130*a* in parallel with a switch S6. Each resistance unit 130*a* includes a switch S7, S8, . . . S25 in series with a resistance R8, R9, . . . R26. The switches S1, S2, . . . S25 are connected to ground. Each display unit 121, 122, . . . 126 includes a current-limiting resistor R1, R2, . . . R6 in series with a light emitting diode (LED) D1, D2, . . . D6.

The display units 121, 122, . . . 126 are connected between first terminals of the outputs 111, 112, . . . 116 and the resistance-matching selectors 131, 132, . . . 136, respectively. The resistance-matching selectors 131, 132, . . . 136 are in turn connected to ground. The voltage adjustable direct current source 140 includes a positive pole selectively connected to the second terminal of one of the outputs 111, 112, . . . 116 via a selective switch S0, and a grounded negative pole.

Over-voltage protection and over-current protection functions of the power supply 100 are tested by providing an over-voltage and an over-current to each of the outputs 111, 112, . . . 116. If when the over-voltage or over-current is provided, and the LED corresponding to the output being tested lights up, then the corresponding protection function of the power supply 100 is not working. On the other hand if the LED does not light up, then the corresponding protection function is working and has shut down the corresponding output. For example, a process of providing an over-current to the output 111 is as follows: Firstly, the positive pole of the direct current source 140 is connected to the second terminal of the output 111. Secondly, a zero resistance of the resistance-matching selector 131 is selected by turning on the switch S1. Thirdly, the direct current source 140 is adjusted to supply a predetermined voltage such that an over-current is provided to the output 111. In this case, if the LED D1 lights, it indicates that current is passing through the LED D1, and the over-current protection function of the power supply 100 at the output 111 is out of order. If the LED D1 does not light, it indicates that current is not passing through the LED D1, and the over-current protection function of the power supply 100 has disabled the output 111. A process of providing an over-voltage to the output 111 is as follows: Firstly, the positive pole of the direct current source 140 is still connected to the second terminal of the output 111. Secondly, the resistance-matching selector 131 is selected to provide a resistance by turning off the switch S1, and turning on at least one of the switches S7, S8, S9, S10. Thirdly, the direct current source 140 is adjusted to supply a predetermined voltage such that an over-voltage is provided to the output 111. In this case, if the LED D1 lights, it indicates that current is passing through the LED D1, and the over-voltage protection function of the power supply 100 at the output 111 is out of order. If the LED D1 does not light, it indicates that current is not passing through the LED D1, and the over-voltage protection function of the power supply 100 at the output 111 is functional, that is, the over-voltage protection function disables the output 111. The resistance-matching selector 131 can be selected to have different resistances by turning one or more of the switches S7, S8, S9, S10 on, such that the over-voltage protection function of the power supply 100 at the output 111 can be tested under different loads. When the over-current protection and over-voltage protection functions of the power supply 100 at the other outputs 112, 113, . . . 116 are tested, the positive pole of the direct current source 140 is connected to the corresponding output 112, 113, . . . 116, and a corresponding resistance-matching selector 132, 133, . . . 136 is selected to have a desired resistance. Thereby, whether the over-voltage protection and over-voltage protection functions of the power supply 100 at the other outputs 112, 113, . . . 116 are functional can be determined by observing the statuses of corresponding LEDs D2, D3, . . . D6.

The resistance-matching selector can be a variable resistor instead.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A system for testing power supply performance, comprising:

a power supply comprising a plurality of outputs for outputting voltages, each of the outputs having a first terminal and a second terminal;

a plurality of display units corresponding to the plurality of outputs, for reflecting performance of the power supply;

a plurality of resistance-matching selectors corresponding to the plurality of outputs, for supplying selective resistance, the display units being connected between the first terminals of the outputs and the resistance-matching selectors, respectively, the resistance-matching selectors being in turn connected to ground;

a voltage adjustable direct current source with a pole selectively connected to the second terminal of one of the outputs via a selective switch, and another pole grounded.

2. The system as claimed in claim 1, wherein each resistance-matching selector comprising at least one resistance unit in parallel with a first switch, the at least one resistance unit comprising a second switch in series with a resistance, the first switch and the second switch being grounded.

3. The system as claimed in claim 1, wherein each display unit comprises a current-limiting resistance and a light emitting diode connected in series.

4. The system as claimed in claim 1, wherein the performance comprises over-voltage protection and over-current protection functions of the power supply.

5. A system for testing power supply performance, comprising:

a power supply comprising a plurality of outputs for outputting voltages;

a plurality of display units corresponding to the plurality of outputs, for reflecting performance of the power supply;

a plurality of variable resistors corresponding to the plurality of outputs, for supplying selective resistance, the display units being connected between first terminals of the outputs and the variable resistors, respectively, the variable resistors being in turn connected to ground;

a voltage adjustable direct current source with a pole selectively connected to a second terminal of one of the outputs via a selective switch, and another pole grounded.

6. The system as claimed in claim 5, wherein each display unit comprises a current-limiting resistance and a light emitting diode connected in series.

7. The system as claimed in claim 5, wherein the performance comprises over-voltage protection and over-current protection functions of the power supply.

* * * * *